(12) United States Patent
Wang et al.

(10) Patent No.: US 11,295,795 B2
(45) Date of Patent: Apr. 5, 2022

(54) DATA READING CIRCUIT AND STORAGE UNIT

(71) Applicants: Semiconductor Manufacturing International (Shanghai) Corporation, Shanghai (CN); Semiconductor Manufacturing International (Beijing) Corporation, Beijing (CN)

(72) Inventors: Tengye Wang, Shanghai (CN); Jiaxu Peng, Shanghai (CN); Tao Wang, Shanghai (CN); Zijian Zhao, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/864,607

(22) Filed: May 1, 2020

(65) Prior Publication Data

US 2020/0357452 A1 Nov. 12, 2020

(30) Foreign Application Priority Data

May 8, 2019 (CN) .......................... 201910380361.6

(51) Int. Cl.
*G11C 11/16* (2006.01)
(52) U.S. Cl.
CPC ...... *G11C 11/1697* (2013.01); *G11C 11/1673* (2013.01); *G11C 11/1675* (2013.01)
(58) Field of Classification Search
CPC ............ G11C 11/1697; G11C 11/1673; G11C 11/1675; G11C 2013/0054; G11C 13/004;
(Continued)

(56) References Cited

U.S. PATENT DOCUMENTS

| 6,674,679 B1* | 1/2004 | Perner | G11C 7/062 |
| | | | 365/189.07 |
| 2011/0222355 A1* | 9/2011 | Nakashima | G11C 11/1673 |
| | | | 365/189.09 |
| 2014/0119094 A1* | 5/2014 | Lee | G11C 11/5685 |
| | | | 365/148 |

OTHER PUBLICATIONS

M. Jefremow et al., "Time-differential sense amplifier for sub-80mV bitline voltage embedded STT-MRAM in 40nm CMOS," 2013 IEEE International Solid-State Circuits Conference Digest of Technical Papers, San Francisco, CA, USA, 2013, pp. 216-217, doi: 10.1109/ISSCC.2013.6487706. (Year: 2013).*

* cited by examiner

*Primary Examiner* — Ajay Ojha
(74) *Attorney, Agent, or Firm* — Anova Law Group, PLLC

(57) ABSTRACT

The present disclosure provides a data reading circuit and a storage unit. The data reading circuit includes a being read unit connected to a voltage stabilizing unit and configured to store data. The voltage stabilizing unit is configured to stabilize and output a current from the being read unit to a first amplifying unit. The first amplifying unit is configured to amplify and output the current from the being read unit to a comparing unit. A reference unit is connected to a second amplifying unit, to output a reference current to the second amplifying unit. The second amplifying unit is configured to amplify and output the reference current to the comparing unit. The comparing unit is configured to compare a comparing point voltage, that is based on the amplified current of the being read unit and the amplified reference current, with a reference voltage and to output comparison results.

18 Claims, 1 Drawing Sheet

(58) Field of Classification Search
CPC .............. G11C 13/0026; G11C 27/024; G11C 11/1655
See application file for complete search history.

DATA READING CIRCUIT AND STORAGE UNIT

CROSS-REFERENCES TO RELATED APPLICATION

This application claims the priority of Chinese Patent Application No. 201910380361.6, filed on May 8, 2019, the content of which is incorporated by reference in its entirety.

TECHNICAL FIELD

The present disclosure generally relates to the field of integrated circuit technology and, more particularly, to a data reading circuit and a storage unit.

BACKGROUND

Magnetic Random-Access Memory (MRAM) has immeasurably broad prospects. Among them, Spin Transfer Torque Magnetic Random-Access Memory (STT-MRAM) is a representative with high read/write speed, high density, low power consumption, long data retention time, and high lifetime. Since an MRAM has resistance variability, it can store data information through its different resistance states. However, due to processing limitations, each cell in the MRAM has a low ratio of high-resistance state and low-resistance state, resulting in a small window for a reading circuit to distinguish the two states, that is, a small reading margin.

In order to determine states of the MRAM, a voltage source is usually applied to an MRAM cell. Since different resistances in the MRAM cell correspond to different currents, states of the MRAM can be determined by evaluating the magnitude of the currents. However, excessive currents may cause rewriting of data stored in the MRAM, resulting in reading disturb. Therefore, it is important to set a proper bit line (BL) reading voltage bias for the MRAM cell. When the BL reading voltage is small, the reading current is small, which causes a large reading error.

The BL reading voltage is often affected by the current of a being read unit. For example, when the BL reading voltage rises beyond an allowable limit, the being read unit may flip, causing incorrect reading.

SUMMARY

One aspect of the present disclosure includes a data reading circuit. The data reading circuit includes a being read unit, a voltage stabilizing unit, a first amplifying unit, a reference unit, a second amplifying unit, and a comparing unit. The being read unit is connected to the voltage stabilizing unit, and the being read unit is configured to store data. The voltage stabilizing unit is connected to the being read unit and the first amplifying unit, and the voltage stabilizing unit is configured to stabilize and output a current from the being read unit to the first amplifying unit. The first amplifying unit is connected to the voltage stabilizing unit, the second amplifying unit, and the comparing unit, and the first amplifying unit is configured to amplify and output the current from the being read unit to the comparing unit. The reference unit is connected to the second amplifying unit, and the reference unit is configured to output a reference current to the second amplifying unit. The second amplifying unit is connected to the reference unit, the first amplifying unit, and the comparing unit, and the second amplifying unit is configured to amplify and output the reference current to the comparing unit. The comparing unit is connected to the first amplifying unit and the second amplifying unit, and the comparing unit is configured to compare a comparing point voltage, that is based on the amplified current of the being read unit and the amplified reference current, with a reference voltage, and to output comparison results.

Another aspect of the present disclosure includes a storage unit. The storage unit includes a data reading circuit. The data reading circuit includes a being read unit, a voltage stabilizing unit, a first amplifying unit, a reference unit, a second amplifying unit, and a comparing unit. The being read unit is connected to the voltage stabilizing unit, and the being read unit is configured to store data. The voltage stabilizing unit is connected to the being read unit and the first amplifying unit, and the voltage stabilizing unit is configured to stabilize and output a current from the being read unit to the first amplifying unit. The first amplifying unit is connected to the voltage stabilizing unit, the second amplifying unit, and the comparing unit, and the first amplifying unit is configured to amplify and output the current from the being read unit to the comparing unit. The reference unit is connected to the second amplifying unit, and the reference unit is configured to output a reference current to the second amplifying unit. The second amplifying unit is connected to the reference unit, the first amplifying unit, and the comparing unit, and the second amplifying unit is configured to amplify and output the reference current to the comparing unit. The comparing unit is connected to the first amplifying unit and the second amplifying unit, and the comparing unit is configured to compare a comparing point voltage, that is based on the amplified current of the being read unit and the amplified reference current, with a reference voltage and to output comparison results.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Excessive current may cause rewriting to data stored in a magnetic random-access memory (MRAM), resulting in reading disturb. Therefore, it is important to set a proper bit line (BL) reading voltage bias for an MRAM cell. When a BL reading voltage is small, a reading current will be small, which causes a large reading error.

Figure 1:
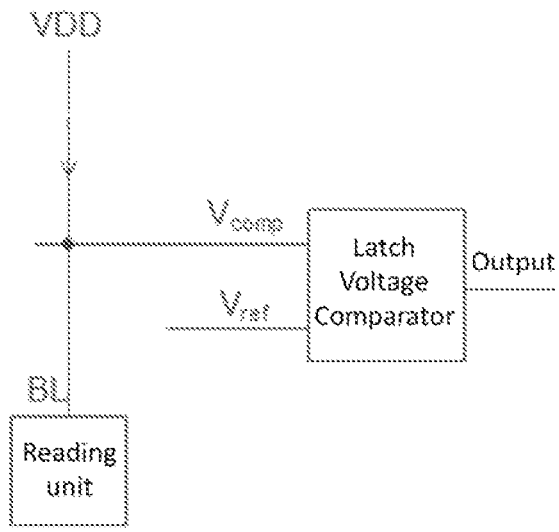
FIG. 1 illustrates a circuit structure diagram of a conventional data reading circuit.

FIG. 1 illustrates a circuit structure diagram of a conventional data reading circuit.

A data reading circuit includes a being read unit and a latch voltage comparator. As can be seen from FIG. 1, a voltage comparing point $V_{comp}$ is directly connected to the BL of a being read unit. When $V_{comp}$ and reference voltage $V_{ref}$ are input and compared in the latch voltage comparator, the BL is affected by current of the being read unit, which causes $V_{comp}$ to change (raise or decrease). In FIG. 1, VDD is a power supply voltage.

Therefore, when the latch voltage comparator compares $V_{comp}$ and $V_{ref}$, a judgment window for distinguishing "1" and "0" states is affected by the change of $V_{comp}$, which affects the reading margin. When the data reading circuit is used to read the MRAM, a reading result may be incorrect.

In one practical application, when a measuring current of the MRAM is low, a long period of reading time is required to generate a sufficiently large difference between $V_{comp}$ and $V_{ref}$. However, a long-time accumulation of the BL voltage offset affects a data retention status of the being read unit. Therefore, this kind of data reading circuit is not fully applicable to MRAM data reading.

In the present disclosure, a voltage stabilizing unit is configured to stabilize and output a current of a being read unit to a first amplifying unit; the first amplifying unit is configured to amplify and output the current of the being read unit to a comparing unit; a second amplifying unit is configured to amplify and output a reference current to the comparing unit. The voltage stabilizing unit stabilizes the current of the being read unit during reading, then the stabilized current of the being read unit is amplified by the first amplifying unit. At the same time, the reference current is amplified by the second amplifying unit. Thereby, the judgment window for reading data can be enlarged, and the reading margin can be effectively improved.

To better clarify the aforementioned objects, features, and advantages of the present disclosure, some embodiments combined with figures are given below to elaborate on the present disclosure.

Figure 2:
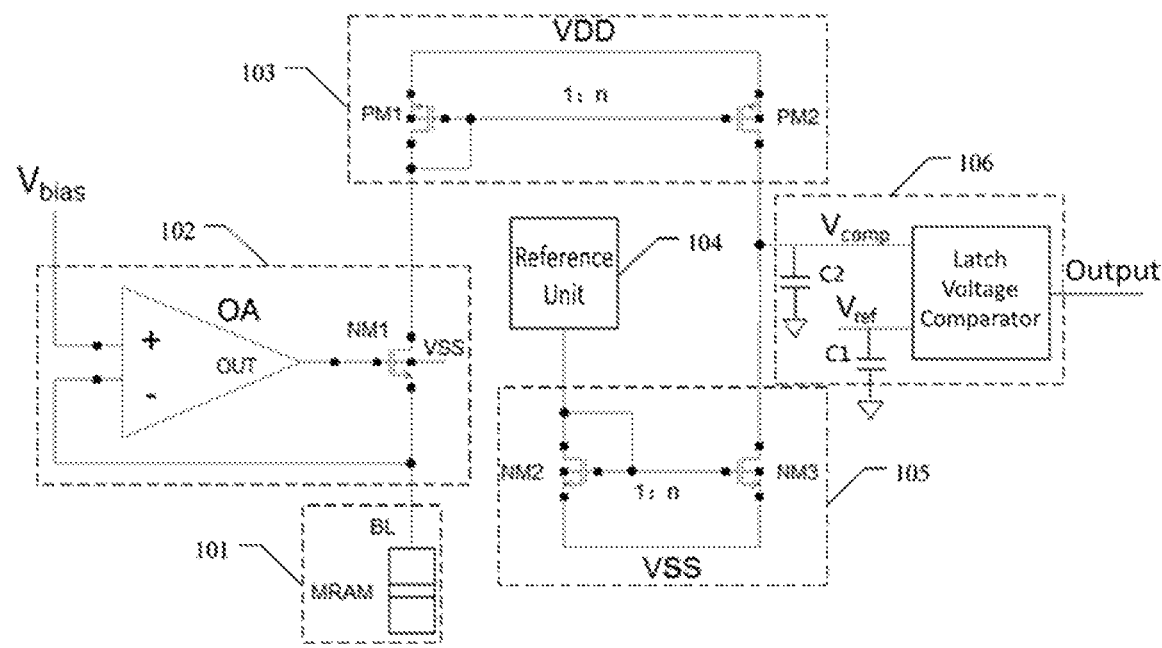
FIG. 2 illustrates a circuit structure diagram of a data reading circuit in one embodiment of the present disclosure.

The present disclosure provides a data reading circuit. Referring to FIG. 2, the data reading circuit includes a being read unit 101, a voltage stabilizing unit 102, a first amplifying unit 103, a reference unit 104, a second amplifying unit 105, and a comparing unit 106.

The being read unit 101, which is configured to store data, has an output end connecting to an input end of the voltage stabilizing unit 102.

The voltage stabilizing unit 102 has an input end connecting to an output end of the being read unit 101, and an output end connecting to an input end of the first amplifying unit 103. The voltage stabilizing unit 102 is configured to stabilize and output a current of the being read unit 101 to the first amplifying unit 103.

The first amplifying unit 103 has an input end connecting to the output end of the voltage stabilizing unit 102, and an output end connecting to an output end of the second amplifying unit 105 and an input end of the comparing unit 106. The first amplifying unit 103 is configured to amplify and output the current of the being read unit 101 to the comparing unit 106.

The reference unit 104 has an output end connecting to the input end of the second amplifying unit 105. The reference unit 104 is configured to output the reference current to the second amplifying unit 105.

The second amplifying unit 105 has an input end connecting to the output end of the reference unit 104 and an output end connecting to the output end of the first amplifying unit 103 and the input end of the comparing unit 106. The second amplifying unit 105 is configured to amplify and output the reference current to the comparing unit 106.

The comparing unit 106 has an input end connecting to the output end of the first amplifying unit 103 and the output end of the second amplifying unit 105. The comparing unit 106 is configured to compare $V_{comp}$ and $V_{ref}$ and to output a comparison result. The $V_{comp}$ is based on the amplified current of the being read unit 101 and the amplified reference current.

In one embodiment, the being read unit 101 includes at least one MRAM.

In one embodiment, each of the first amplifying unit 103 and the second amplifying unit 105 can adopt a current mirror method, in which the current of the being read unit 101 and the reference current are respectively amplified and output to the input end of the comparing unit 106 for comparison.

In one practical application, when the current of the being read unit 101 and the reference current are amplified and output to the comparing unit 106 for comparison, the high-resistance state and low-resistance state of the MRAM can be easily distinguished. In a conventional method, the being read unit current and the reference current are directly compared, which causes an insufficient judgment margin. Compared with the conventional method, the present disclosure provides a more reliable data reading circuit.

In one embodiment, the first amplifying unit 103 amplifies the current of the being read unit 101 by a same multiple as the second amplifying unit 105 amplifies the reference current.

In one practical application, a ratio of the current of the being read unit 101 before and after amplification is 1:n, and a ratio of the reference current before and after amplification is also 1:n, that is, the current of the being read unit 101 and the reference current are both amplified by n times. Therefore, the current of the being read unit 101 and the reference current affect the comparing point voltage $V_{comp}$ at a same multiple.

In one embodiment, the voltage stabilizing unit 102 can receive an external bias voltage $V_{bias}$, which is below a preset threshold. Since $V_{bias}$ is below the preset threshold, the comparing point voltage $V_{comp}$ is also limited, avoiding "flipping" of the being read unit 101 that results in data reading errors.

In one embodiment, the voltage stabilizing unit 102 can receive an external bias voltage $V_{bias}$ and maintain a BL voltage of the being read unit 101 same as $V_{bias}$, effectively stabilizing the BL voltage.

In one practical application, the comparing unit 106 can amplify and output a relative difference between $V_{comp}$ and $V_{ref}$ to achieve the purpose of reading data from the being read unit 101. Meanwhile, the comparing unit 106 is not directly connected to the BL of the being read unit 101, which can prevent the BL voltage from being affected by the current of the being read unit 101.

In one practical application, when the amplified current of the being read unit 101 is larger than the reference current, the $V_{comp}$ rises; when the amplified current of the being read unit 101 is smaller than the reference current, the $V_{comp}$ decreases. The input end of the comparing unit 106 receives $V_{comp}$ and $V_{ref}$, performs a comparison, and outputs a comparison result. The increase or decrease of $V_{comp}$ can amplify the relative difference between $V_{comp}$ and $V_{ref}$ thus improve the reading margin.

In one embodiment, the voltage stabilizing unit 102 can include an operational amplifier OA and a first NMOS transistor NM1. The operational amplifier OA has a non-inverting input end connecting to an external bias voltage $V_{bias}$, an inverting input end connecting to the output end of the being read unit 101 and a drain of the first NMOS transistor NM1, and an output end connecting to a gate of the first NMOS transistor NM1. The first NMOS transistor NM1 has a source connecting to the input end of the first amplifying unit 103.

In one embodiment, the first amplifying unit 103 can include at least two PMOS transistors for amplifying the current of the being read unit 101.

In one embodiment, the first amplifying unit 103 can include a first PMOS transistor PM1 and a second PMOS transistor PM2. The first PMOS transistor PM1 has a gate connecting to a gate of the second PMOS transistor PM2, the output end of the voltage stabilizing unit, and a drain of the first PMOS transistor PM1. The first PMOS transistor PM1 has a source connecting to a source of the second PMOS transistor PM2. The second PMOS transistor PM2 has a drain connecting to the output end of the second amplifying unit 105 and the input end of the comparing unit 106.

In one practical application, a current flowing through PM1 is equal to a current flowing through the being read unit 101, and the current of the being read unit 101 is amplified by n times through PM2.

In one embodiment, the second amplifying unit 105 can include at least two NMOS transistors for amplifying the reference current.

In one embodiment, the second amplifying unit 105 may include a second NMOS transistor NM2 and a third NMOS transistor NM3. The second NMOS transistor NM2 has a gate connecting to an output end of the reference unit 104, a source of the second NMOS transistor NM2, and a gate of the third NMOS transistor NM3. The second NMOS transistor NM2 has a drain connecting to a drain of the third NMOS transistor NM3. The third NMOS transistor NM3 has a source connecting to the output end of the first amplifying unit 103 and the input end of the comparing unit 106.

In one practical application, a current flowing through NM2 is equal to a current flowing through the reference unit 104, and the current flowing through the reference unit 104 is amplified by n times through NM3.

In one practical application, $V_{comp}$ and $V_{ref}$ can be charged to a same potential. Then $V_{ref}$ remains unchanged, and $V_{comp}$ changes with the change of currents flowing through PM2 and NM3, which increases the relative difference between $V_{comp}$ and $V_{ref}$ and enlarges the judgment window of data reading.

In one embodiment, the comparing unit 106 can include a latch voltage comparator. The latch voltage comparator has an input end connecting to the output end of the first amplifying unit 103 and the output end of the second amplifying unit 105, another input end connecting to the reference voltage $V_{ref}$, and an output end for outputting a comparison result.

In one embodiment, the comparing unit 106 can include a first capacitor C1 and a second capacitor C2. One ends of the first capacitor C1 and the second capacitor are respectively connected to two input ends of the comparing unit, and another ends of both the first capacitor C1 and the second capacitor C2 are grounded.

In one practical application, the reference unit 104 can be a unit in a data memory array or a combination of replacement resistors, which is not limited in the present disclosure.

In one embodiment, a substrate of all PMOS transistors is connected to a power supply VDD, and a substrate of all NMOS transistors is grounded to VSS.

In one practical application, a ratio of the high-resistance and low-resistance states of the MRAM is low, and a BL reading voltage of the MRAM is also low. Using the data reading circuit provided by the present disclosure can greatly improve the margin for judging data memory states. Therefore, the data reading circuit provided by the present disclosure can effectively improve the reading margin for a data memory having a low ratio of high-resistance and low-resistance states, a low BL reading voltage, or both.

In summary, the voltage stabilizing unit 102 keeps the current of the being read unit 101 stable during the reading process, and then the first amplified unit 103 amplifies the stabilized current of the being read unit 101, while the second amplifying unit 105 amplifies the reference current, which enlarges the judgment window for reading data and effectively improves the reading margin.

An embodiment of the present disclosure further provides a storage unit, which includes a data reading circuit provided in the foregoing embodiments of the present disclosure.

As disclosed, the technical solutions of the present disclosure have the following advantages: the voltage stabilizing unit is configured to stabilize and output the current of the being read unit to the first amplifying unit; the first amplifying unit is configured to amplify and output the current of the being read unit to the comparing unit; the second amplifying unit is configured to amplify and output the reference current to the comparing unit. The voltage stabilizing unit keeps the current of the being read unit stable during the reading process, and then the first amplifying unit amplifies the stabilized current of the being read unit, while the second amplifying unit amplifies the reference current, which can enlarge the judgment window for reading data and effectively improve the reading margin. Further, the voltage stabilizing unit receives an external bias voltage, which is below a preset threshold. Because the external bias voltage is below the preset threshold, the voltage at the comparing point is also limited, which avoids the "flipping" of being read unit that causes data reading errors.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A data reading circuit, comprising: a being read unit, a voltage stabilizing unit, a first amplifying unit, a reference unit, a second amplifying unit, and a comparing unit, wherein:
   the being read unit is connected to the voltage stabilizing unit, and the being read unit is configured to store data;
   the voltage stabilizing unit has an input end connected to the being read unit and an output end connected to the first amplifying unit, and the voltage stabilizing unit is configured to stabilize and output a current from the being read unit to the first amplifying unit;
   the first amplifying unit is connected to the voltage stabilizing unit, the second amplifying unit, and the comparing unit, and the first amplifying unit is configured to amplify and output the current from the being read unit to the comparing unit, wherein the first amplifying unit includes at least two PMOS transistors for amplifying the current of the being read unit;
   the reference unit is connected to the second amplifying unit, and the reference unit is configured to output a reference current to the second amplifying unit;
   the second amplifying unit is connected to the reference unit, the first amplifying unit, and the comparing unit, and the second amplifying unit is configured to amplify and output the reference current to the comparing unit; and the comparing unit is connected to the first amplifying unit and the second amplifying unit, and the comparing unit is configured to compare a comparing point voltage, that is based on the amplified current of the being read unit and the amplified reference current, with a reference voltage, and to output comparison results.

2. The circuit according to claim 1, wherein the first amplifying unit amplifies the current of the being read unit by a same multiple as the second amplifying unit amplifies the reference current.

3. The circuit according to claim 1, wherein the voltage stabilizing unit is configured to receive an external bias voltage, and the external bias voltage is lower than a preset threshold.

4. The circuit according to claim 1, wherein the voltage stabilizing unit is configured to receive an external bias voltage and maintain a bit line voltage of the being read unit same as the external bias voltage.

5. The circuit according to claim 1, wherein the being read unit includes at least one magnetic random-access memory.

6. The circuit according to claim 1, wherein the voltage stabilizing unit includes an operational amplifier and a first NMOS transistor, wherein:
the operational amplifier has:
a non-inverting input end connecting to the external bias voltage,
an inverting input end connecting to an output end of the being read unit and a drain of the first NMOS transistor, and
an output end connecting to a gate of the first NMOS transistor; and
the first NMOS transistor has a source connecting to the first amplifying unit.

7. The circuit according to claim 1, wherein the first amplifying unit includes a first PMOS transistor and a second PMOS transistor, wherein:
the first PMOS transistor has a gate connecting to a gate of the second PMOS transistor, the voltage stabilizing unit, and a drain of the first PMOS transistor, and has a source connecting to a source of the second PMOS transistor; and
the second PMOS transistor has a drain connecting to the second amplifying unit and the comparing unit.

8. The circuit according to claim 1, wherein the second amplifying unit includes at least two NMOS transistors for amplifying the reference current.

9. The circuit according to claim 1, wherein the second amplifying unit includes a second NMOS transistor and a third NMOS transistor, wherein:
the second NMOS transistor has a gate connecting to the reference unit, a source of the second NMOS transistor, and a gate of the third NMOS transistor, and has a drain connecting to a drain of the third NMOS transistor; and
the third NMOS transistor has a source connecting to the first amplifying unit and the comparing unit.

10. A data reading circuit, comprising: a being read unit, a voltage stabilizing unit, a first amplifying unit, a reference unit, a second amplifying unit, and a comparing unit, wherein:
the being read unit is connected to the voltage stabilizing unit, and the being read unit is configured to store data;
the voltage stabilizing unit is connected to the being read unit and the first amplifying unit, and the voltage stabilizing unit is configured to stabilize and output a current from the being read unit to the first amplifying unit;
the first amplifying unit is connected to the voltage stabilizing unit, the second amplifying unit, and the comparing unit, and the first amplifying unit is configured to amplify and output the current from the being read unit to the comparing unit;
the reference unit is connected to the second amplifying unit, and the reference unit is configured to output a reference current to the second amplifying unit;
the second amplifying unit is connected to the reference unit, the first amplifying unit, and the comparing unit, and the second amplifying unit is configured to amplify and output the reference current to the comparing unit; and
the comparing unit is connected to the first amplifying unit and the second amplifying unit, and the comparing unit is configured to compare a comparing point voltage, that is based on the amplified current of the being read unit and the amplified reference current, with a reference voltage, and to output comparison results, wherein the comparing unit includes a latch voltage comparator, which has an input end connecting to the first amplifying unit and the second amplifying unit, another input end connecting to the reference voltage, and an output end for outputting the comparison results.

11. The circuit according to claim 10, wherein the comparing unit includes a first capacitor and a second capacitor, one end of the first capacitor and one end of the second capacitor are respectively connected to two input ends of the comparing unit, and another ends of both the first capacitor and the second capacitor are grounded.

12. A storage unit, comprising:
a data reading circuit, comprising: a being read unit, a voltage stabilizing unit, a first amplifying unit, a reference unit, a second amplifying unit, and a comparing unit, wherein:
the being read unit is connected to the voltage stabilizing unit, and the being read unit is configured to store data;
the voltage stabilizing unit has an input end connected to the being read unit and an output end connected to the first amplifying unit, and the voltage stabilizing unit is configured to stabilize and output a current from the being read unit to the first amplifying unit;
the first amplifying unit is connected to the voltage stabilizing unit, the second amplifying unit, and the comparing unit, and the first amplifying unit is configured to amplify and output the current from the being read unit to the comparing unit, wherein the first amplifying unit includes at least two PMOS transistors for amplifying the current of the being read unit;
the reference unit is connected to the second amplifying unit, and the reference unit is configured to output a reference current to the second amplifying unit;
the second amplifying unit is connected to the reference unit, the first amplifying unit, and the comparing unit, and the second amplifying unit is configured to amplify and output the reference current to the comparing unit; and
the comparing unit is connected to the first amplifying unit and the second amplifying unit, and the comparing unit is configured to compare a comparing point voltage, that is based on the amplified current of the being read unit and the amplified reference current, with a reference voltage and to output comparison results.

13. The storage unit according to claim 12, wherein the first amplifying unit amplifies the current of the being read unit by a same multiple as the second amplifying unit amplifies the reference current.

14. The storage unit according to claim 12, wherein the voltage stabilizing unit is configured to receive an external bias voltage, and the external bias voltage is lower than a preset threshold.

15. The storage unit according to claim 12, wherein the voltage stabilizing unit is configured to receive an external bias voltage and maintain a bit line voltage of the being read unit same as the external bias voltage.

16. The storage unit according to claim 12, wherein the being read unit includes at least one magnetic random-access memory.

17. The storage unit according to claim 12, wherein the voltage stabilizing unit includes an operational amplifier and a first NMOS transistor, wherein:
   the operational amplifier has:
      a non-inverting input end connecting to the external bias voltage,
      an inverting input end connecting to an output end of the being read unit and a drain of the first NMOS transistor, and
      an output end connecting to a gate of the first NMOS transistor; and
   the first NMOS transistor has a source connecting to the first amplifying unit.

18. The storage unit according to claim 12, wherein the first amplifying unit includes a first PMOS transistor and a second PMOS transistor, wherein:
   the first PMOS transistor has a gate connecting to a gate of the second PMOS transistor, the voltage stabilizing unit, and a drain of the first PMOS transistor, and has a source connecting to a source of the second PMOS transistor; and
   the second PMOS transistor has a drain connecting to the second amplifying unit and the comparing unit.

\* \* \* \* \*